Jan. 14, 1958 E. O. KEIZER ET AL 2,820,111

KEYED AUTOMATIC GAIN CONTROL MEANS

Filed March 1, 1954

INVENTORS
EUGENE O. KEIZER &
MARLIN G. KROGER

BY [signature]
ATTORNEY

United States Patent Office
2,820,111
Patented Jan. 14, 1958

2,820,111

KEYED AUTOMATIC GAIN CONTROL MEANS

Eugene O. Keizer, Princeton, N. J., and Marlin G. Kroger, Oak Park, Ill., assignors to Radio Corporation of America, a corporation of Delaware Application March 1, 1954, Serial No. 413,119

3 Claims. (Cl. 179—171)

The present invention relates to improvements in automatic gain control circuits, and more particularly, although not necessarily exclusively, to improvements in automatic gain control circuits of the type adapted for use in television signal reception.

More directly, the present invention relates to improved means for increasing the effective noise immunity of automatic gain control circuits in general, with particular attention being directed to means for improving the noise immunity of keyed automatic gain control circuits, such as for example sometimes employed in television receiver design.

Noise immunity in a radio receiver having an automatic gain control circuit depends upon the ability of the gain control circuit to respond quickly to variations in amplitude of the received radio signal carrier, yet to effectively ignore changes in apparent signal strength attributable to noise bursts and the like.

In the prior art, the approach to achieving increased noise immunity in automatic gain control circuits has been generally on a time constant basis. By making the time constant or "response time" of the AGC (automatic gain control) circuit sufficiently long, rapid changes in effective strength of received signals due to noise bursts do not affect the developed automatic gain control potential to any appreciable extent. However, as the time constant of the AGC circuit is made too long, rapid variations in the received carrier strength, as for example caused by well known airplane "flutter" interference in U. H. F. and V. H. F. signal reception, will not be sufficiently compensated or corrected.

The present invention permits the realization of improved noise immunity in automatic gain control circuits without undesirably increasing the overall time constant of the system, by providing means which will reduce the maximum automatic gain control potential that can be developed by the system during the reception of weak signals, while increasing the maximum available automatic gain control potential during the reception of strong signals. In this way, noise bursts occurring during weak signals will contribute less overall energy toward the development of automatic gain control potential than a corresponding increase of signal strength (for example, due to airplane "flutter") at higher signal levels. This technique may be applied to many forms of automatic gain control circuits with a consequent improvement in their net noise immunity.

It is, therefore, an object of the present invention to provide a new and improved automatic gain control circuit.

It is further an object of the present invention to provide an improved noise immunizing circuit applicable to automatic gain control circuits in general.

It is yet another object of the present invention to provide a new and improved noise immunizing circuit for automatic gain control circuits finding particular application in television signal receiving circuits.

It is also an object of the present invention to provide a new and improved automatic noise immunizing system for automatic gain control circuits of the keyed type, as for example employed in many well known forms of television receiving circuits.

The present invention is particularly applicable to keyed types of automatic gain control circuits in which the keying signal is controllably rectified to produce a potential from which is ultimately derived an automatic gain control voltage. In such circuits it is contemplated to provide means for controlling the amplitude of the keying signal as a function of received signal strength. For example, as the received signal strength decreases, the amplitude of the keying pulses will by suitable means, in accordance with the present invention, be reduced so that noise bursts will provide less contribution to the overall automatic gain control potential than they would had no correction in keying signal amplitude been made. As the received signal strength increases, the amplitude of the keying pulse is, in accordance with the present invention, suitably increased.

Another important feature of the present invention resides in the provision of novel means for controlling the amplitude of keying pulses, as a function of received signal strength in, for example, television type receivers, where the keying pulse is derived from the flyback pulse of the horizontal deflection circuit.

A more complete understanding of the present invention, as well as a fuller appreciation of its objects and unique features of advantage will be obtained through a reading of the following specification, especially when taken in connection with the accompanying drawings, in which.

Figure 1:
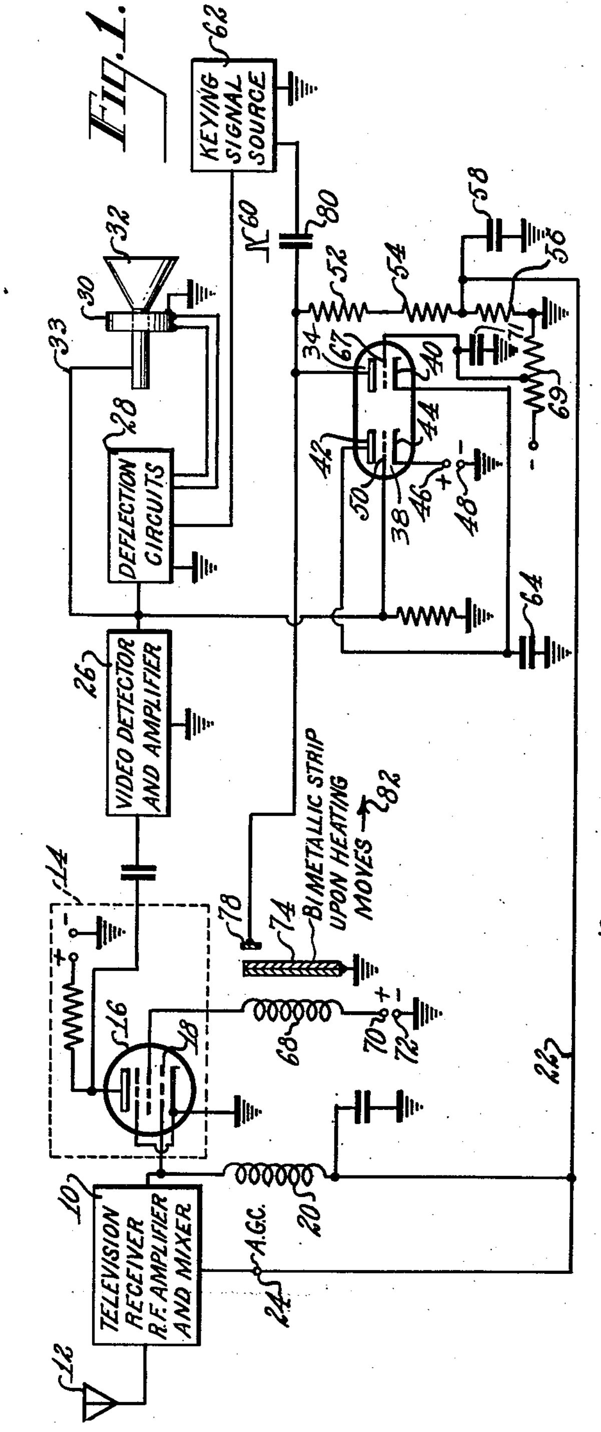
Figure 1 is a combination block and schematic representation of one form of television receiving circuit, in which the present invention finds ready employment.

Turning now to Figure 1, there is indicated in block form at 10 the conventional elements of a television receiver tuning device, which is capable of receiving radio frequency signals on the antenna 12 and converting them to intermediate frequency: signals if applied to an intermediate frequency amplifier stage shown in the blocked rectangle 14. The intermediate frequency amplifier shown in block 14 includes a vacuum tube 16 whose control electrode 18 is connected through an isolating inductor 20 to an AGC bus 22. The AGC bus 22 is also connected to the terminal 24 of the tuner 10. Automatic gain control potential appearing on the bus 22 will, therefore, control the gain of both the intermediate frequency amplifier and R. F. tuner. Additional stages of intermediate frequency amplification may be included within the dotted rectangle 14, if desired. For purposes of illustrational convenience, only a single stage has been shown.

Output signal from the intermediate frequency amplifier 14 is shown to be capacitively coupled to the video frequency detector and amplifier 26, whose output signal is in turn coupled to the deflection circuits indicated in block form at 28. Deflection signals developed by the deflection circuits 28 are applied to an electromagnetic deflection yoke 30, surrounding the neck of the kinescope 32. Video signal applied to the deflection circuits 28 is also conveyed by a circuilt path 33 to a suitable electrode within the kinescope 32 for video signal modulation of electron beam therein.

The particular form of automatic gain control circuit shown in Figure 1 is of a type described and claimed in copending United States patent application, Serial No. 402,007, filed January 4, 1954, entitled Automatic Gain Control Means, by E. O. Keizer et al. In this referenced patent application, two tubes are serially connected with one another across a source of cyclically recurrent alternating current signal. A storage capacitor is then connected from the junction of the two tubes to one terminal of the source of cyclically recurrent alternating signal whereby to permit one of the tubes to act as a unilateral conductive charging means for the capacitor. Received radio signal is then applied to the other tube to control its impedance in effectively discharging the storage capacitor. Charging current through the first tube for replacing the charge dissipated by the second tube is then monitored to develop an automatic gain control potential. This basic arrangement described in the Keizer application is illustrated in Figure 1 of this case. The two serially connected tubes of the Keizer et al. system are here shown as tubes 34 and 38. The cathode 40 of tube 34 is connected with the output electrode 42 of tube 38. For purposes of convenience, the tubes 34 and 38 have been shown as being in the same envelope such as, for example, provided by a 6SN7 type tube. A source of positive biasing potential for the cathode 44 of tube 38 may be applied across the terminals 46 and 48 with the polarity indicated. Demodulated and amplified video signal is applied directly to the control electrode 50 of tube 38. A load circuit comprising resistors 52, 54 and 56 is connected from the anode of tube 34 to circuit ground. A storage capacitor 58 is connected in shunt with that portion of the anode load resistance for tube 34 provided by the resistor 56. Keying signals 60 are applied to the anode of tube 34 from a keying signal source 62 which may be, in some instances, incorporated in the deflection circuits 28. It is common practice in the art to derive keying signals which are synchronously related to received horizontal synchronizing pulses directly from the horizontal deflection yoke winding or other points in the output circuit of the horizontal deflection amplifier. A capacitor 64 is connected from the cathode 40 of tube 34 and circuit ground. Control electrode 67 of tube 34 is connected with a bias bleeder resistor 69. A bias potential, negative with respect to circuit ground, may be connected to the free extremity of resistor 69. Capacitor 71 maintains the control electrode 67 at substantially ground potential whereby to afford shielding between anode and cathode of the tube. This prevents feedthrough of keying pulses to the deflection circuits proper.

The basic operation of the television receiving system, as well as illustrations of well known circuitry for the block elements in Figure 1, as well as the block elements hereinafter to be discussed, is set forth in the "Radio Set and Service Review" section of the "Radio Electronics" magazine for November 1950, pages 34 and 36. The operating principle of the basic automatic gain control circuit shown in Figure 1 hereof as embracing tubes 34 and 38 is disclosed in the above identified Keizer et al. application and is substantially as follows:

In Figure 1 hereof, the pulse keying signal 60 applied to the anode of tube 34 is rectified to develop a potential across the storage capacitor 64. The pulse 60 will be effectively peak detected so that the voltage across capacitor 64 will represent to a substantial degree the peak value of the pulse 60 during the reception of weak signals. Upon the increase in signal strength of an incoming television signal, and assuming a sync positive polarity for the signal delivered by the video detector amplifier 26 to the grid 50 of tube 38, tube section 38 will become more conductive and tend to bleed some of the charge from capacitor 64. Tube 34 will, therefore, conduct upon the occurrence of the next pulse applied to its anode in an attempt to recharge the capacitor 64. This charging current must of necessity flow through the resistors 52, 54 and 56, and, therefore, develop an automatic gain control potential across the resistor 56. The value of capacitor 58 is chosen in conjunction with the value of resistor 56 to provide a suitable time constant for the automatic gain control system.

In accordance with the present invention it will be noted that the screen electrode of the video I. F. amplifier 16 is connected through a heater coil 68 to a source of polarizing potential having a positive terminal at 70 and negative terminal at 72. Heating coil 68 is physically positioned in thermal coupling relation with respect to a bimetallic strip 74 which is connected with circuit ground. A capacitor plate 78 is positioned with respect to the bimetallic strip 74 so as to provide a variable capacitance unit which is sensitive to changes in heat developed by the heater coil 68. The capacitor plate 78 is connected, in accordance with the present invention, to the upper terminal of resistor 52, whereby to form a capacitance voltage divider circuit, comprising the coupling capacitor 80 and any capacitance that exists between the plate 78 and the bimetallic strip 74.

In the operation of the present invention, a reduction in the average value of received signal strength will reduce the amount of charge bled from capacitor 64 through the tube 38. This will necessitate less charging current in the tube 34 to keep the capacitor 64 charged to a stabilized value. The voltage drop across resistor 56 will, therefore, decrease and the AGC bus 22 will assume a potential less negative with respect to circuit ground. This will, in accordance with conventional receiver design techniques, increase the gain of the signal amplifiers within the tuner 10 and the video intermediate frequency amplifier 14. As the control electrode 18 of tube 16 becomes less negative with respect to circuit ground, current through the tube 16 will increase and the heat radiated by the coil 68 will cause the bimetallic strip 74 to move in the direction of the arrow 82. This will increase the capacity between the bimetallic strip 74 and the plate 78, thereby causing the amplitude of keying signal 60 applied to the tube 34 to decrease.

Under these conditions, attending lower signal strength reception, a received noise pulse of high instantaneous peak amplitude will cause the development of only a limited increase in the negative voltage appearing across the capacitor 58 due to the reduced peak amplitude of the available keying signal. This is clear in view of the fact that the charge developed across the capacitor 58 is a direct result of the rectification of the keying signal. However, upon the reception of a stronger average signal, the AGC bus 22 will assume an average potential more negative with respect to circuit ground and decrease the average current flow through the video I. F. amplifier 16. Less heat will, therefore, be applied to the bimetallic strip 74 which will then move away from plate 78 and consequently reduce the capacity existing between the strip 74 and the plate 78. This reduction in capacity will increase the amplitude of keying signal applied to the anode of tube 34 and increase the maximum negative voltage to which the capacitor 58 may be charged. This will enhance the operation of the receiver in its effort to receive strong signals since it will be able to more completely correct for rapid changes in received signal intensity typified by well known "airplane flutter." Thus the maximum influence the automatic gain control circuit can impose on the amplifier gain is rendered a function of received signal strength.

Figure 2:
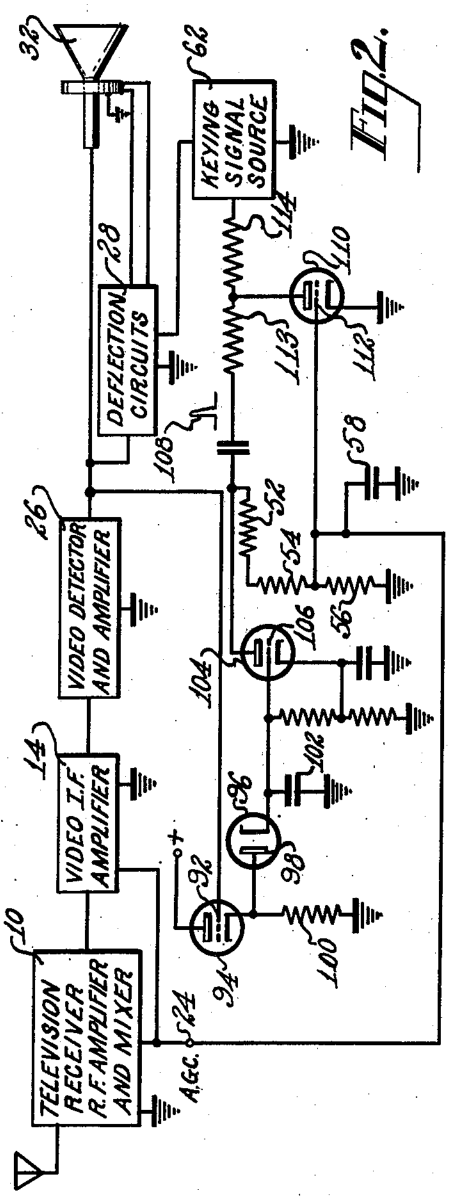
Figure 2 is a block and schematic representation of still another form of television receiving system, in which the present invention is embodied.

In the embodiment of the invention shown in Figure 2, there is shown still another way of modifying the available peak amplitude of automatic gain control voltage as a function of signal strength. The basic television receiving circuit of Figure 2 is substantially the same as that shown in Figure 1 and correspondingly like elements in both figures have been given like reference numerals.

In Figure 2, however, demodulated video signal appearing at the output terminal of the video frequency amplifier 26 is applied to the control electrode 92 of a cathode follower amplifier stage 94. A diode detector 96 has its anode 98 connected with the cathode of the cathode follower tube 94. Signals appearing across the cathode follower load resistor 100 are, therefore, peak detected to produce a charge on the capacitor 102 which is proportional to the peak amplitude of the received signal. The AGC amplifier stage 104 is supplied with peak signal information by connecting its control electrode 106 to the capacitor 102. The tube 104 is rendered conductive by pulses 108 derived from a keying signal source 62, as in Figure 1. Load resistors 52, 54 and 56, as well as capacitor 58, provide the same functions as they do in Figure 1, so that an automatic gain control potential is available at the AGC terminal 24.

However, in accordance with the present invention, the amplitudes of the keying pulses 108 are caused to vary in accordance with received signal strength by means of the bleeder tube 110 connected in shunt with the pulse dropping resistors 113 and 114. The control electrode 112 of the average value of bleeder tube 110 is connected with the AGC bus terminal 24. In this way, as the received signal increases in intensity, the AGC voltage will become more negative with respect to circuit ground, thereby reducing the bleeder effect of tube 110 across the dropping resistors 113 and 114. This will result in an increase in the amplitude of the keying pulse 108 and make available a higher amplitude of AGC voltage should instantaneous changes in the amplitude of received signal take place as described hereinabove. Correspondingly, as the average value of received carrier is reduced, the potential at the AGC bus terminal 24 becomes more positive and increases the conductance in tube 110 to reduce the amplitude in the keying pulses 108 applied to the amplifier 104. In this way the maximum amplitude of AGC potential it is possible to develop is reduced whereby to minimize the effects of noise bursts in the reception of low values of received carrier.

What is claimed is:

1. In a keyed automatic gain control system, the combination of: an automatic gain controlled amplifier designated to handle a signal whose amplitude undesirably varies, said amplifier including means rendering its power supply demands a function of the influence imposed thereon by an automatic gain control potential; a power supply for said amplifier; a heater element connected between said power supply and said amplifier for developing heat in accordance with amplifier power supply demands; a thermal actuated variable capacitance means thermally coupled with said heater element; an automatic gain controlled circuit of the keyed type operatively connected with said amplifier to deliver thereto an automatic gain control potential, said automatic gain control circuit being of the type operative to accept keying pulses whose amplitude define in part the magnitude of the automatic gain control potential developed thereby; a source of keying signal operatively connected to said automatic gain control circuit; means controlling the amplitude of keying signals applied to said gain control circuit as a function of the amplitude of signal applied to said amplifier, said means for controlling the amplitude of said keying signals comprising an impedance voltage divider means operatively including said variable capacitance means.

2. In a keyed AGC system the combination of: an automatic gain controlled amplifier for amplification of a signal whose amplitude undesirably varies; an automatic gain control circuit of the keyed type operatively connected with said amplifier for supplying a gain control potential thereto, said gain control circuit being of the type operative to accept and utilize keying pulses whose amplitude define in part the value of automatic gain control potential developed by said automatic gain control circuit; a source of keying signals for application to said gain control circuit for keying thereof; a resistive voltage divider network operatively connected between said source of keying signals and said gain control circuit operatively supplying keying pulses to said automatic gain control circuit; a signal responsive variable resistance device connected in shunt with at least a portion of said voltage dividing network in controlling relation to the voltage dividing action imposed on keying pulses applied to said automatic gain control circuit; and a direct current connection between the said automatic gain control circuit and said variable resistance device controlling the resistance value thereof in accordance with developed automatic gain control potential.

3. In a radio receiving system the combination of: an amplifier for amplifying received radio signals, said amplifier being capable of gain control by an automatic gain control voltage; means developing a keying voltage of substantially fixed amplitude and frequency; a keyed automatic gain control circuit having a signal input terminal, a keying voltage input terminal and an automatic gain control voltage output terminal, said gain control circuit being characterized by the fact that the maximum value of automatic gain control voltage said circuit is capable of developing at said output terminal is inherently a function of the amplitude of keying voltage applied to said keying voltage input terminal; means connecting said automatic gain control circuit output terminal to said amplifier for automatic gain control thereof; means coupled with said keying voltage developing means for controlling the amplitude of keying voltage delivered thereby; means applying said controlled keying voltage to said keying voltage input terminal of said automatic gain control circuit; and means applying to said amplitude controlling means a control potential representing received radio signal strength with such electrical sense as to control said maximum value of automatic gain control potential capable of being developed by said automatic gain control circuit as a function of received signal strength.

References Cited in the file of this patent

UNITED STATES PATENTS

| | | |
|---|---|---|
| 2,404,160 | Boucke | July 16, 1946 |
| 2,527,441 | O'Brien | Oct. 24, 1950 |
| 2,559,038 | Bass | July 3, 1951 |
| 2,609,443 | Avins | Sept. 2, 1952 |
| 2,615,977 | Sziklai et al. | Oct. 28, 1952 |
| 2,700,074 | Cotsworth III | June 18, 1955 |